United States Patent [19]
Kobayashi et al.

[11] Patent Number: 5,973,359
[45] Date of Patent: Oct. 26, 1999

[54] MOS TYPE SEMICONDUCTOR DEVICE

[75] Inventors: Takashi Kobayashi; Tatsuhiko Fujihira; Shigeyuki Takeuchi; Yoshiki Kondo; Shoichi Furuhata, all of Nagano, Japan

[73] Assignee: Fuji Electric Co., Ltd., Japan

[21] Appl. No.: 09/190,929

[22] Filed: Nov. 12, 1998

[30] Foreign Application Priority Data

Nov. 13, 1997 [JP] Japan ..................... 9-311631

[51] Int. Cl.$^6$ ............... H01L 29/76; H01L 29/94
[52] U.S. Cl. ............... 257/328; 257/356; 257/360
[58] Field of Search ................... 257/328, 356, 257/360, 620, 173, 327

[56] References Cited

U.S. PATENT DOCUMENTS

| | | | |
|---|---|---|---|
| 5,089,871 | 2/1992 | Fujihara | 357/23.8 |
| 5,266,831 | 11/1993 | Phipps et al. | 257/620 |
| 5,270,566 | 12/1993 | Fujihara | 257/368 |
| 5,304,802 | 4/1994 | Kumagai | 257/173 |
| 5,401,985 | 3/1995 | Anceau | 257/173 |
| 5,448,092 | 9/1995 | Okabe et al. | 257/173 |
| 5,886,381 | 3/1999 | Frisina | 257/328 |

*Primary Examiner*—Donald L. Monin, Jr.
*Attorney, Agent, or Firm*—Rossi & Associates

[57] ABSTRACT

A MOS type semiconductor device is provided which includes a series Zener diode array for overvoltage protection, which is provided between source regions and an electrode having substantially the same potential as a drain electrode, and a field insulating film on which the series Zener diode array is provided. The thickness T ($\mu$m) of the field insulating film is determined as a function of the clamp voltage $V_{CE}$ (V) of the series Zener diode array, such that the thickness T is held in the range as represented by: $T \geq 2.0 \times 10^{-3} \times V_{CE}$. The width $W_1$ ($\mu$m) of a portion of a second-conductivity-type isolation well that is close to the field insulating film on which the series Zener diode array is provided, and the width $W_2$ ($\mu$m) of a portion of the second-conductivity-type isolation well that is close to the field insulating film on which the series Zener diode array is not provided, are determined as a function of the clamp voltage $V_{CE}$ of the series Zener diode array, such that the widths $W_1$, $W_2$ are held in respective ranges as represented by: $W_1 \geq 0.15\ V_{CE}$, and $W_2 \geq 0.05\ V_{CE}$. By controlling the widths $W_1$, $W_2$ to these ranges, respectively, the concentration of current into an end portion of the cell portion of the device can be prevented upon cut-off of current from an inductive load.

6 Claims, 6 Drawing Sheets

MOS TYPE SEMICONDUCTOR DEVICE

FIELD OF THE INVENTION

The present invention relates to a MOS type semiconductor device, such as a MOS field-effect transistor (hereinafter referred to as "MOSFET") or an insulated gate bipolar transistor (hereinafter referred to as "IGBT"), wherein a plurality of source regions having gates of metal-oxide-semiconductor (MOS) structure are separately formed in a surface layer of a semiconductor substrate.

BACKGROUND OF THE INVENTION

To produce a MOSFET as one type of the MOS type semiconductor device, a plurality of p base regions are formed by diffusing impurities into selected areas of a surface layer of an n type semiconductor substrate such that pn junctions appear on the surface of the substrate, and n source regions are formed in surface layers of the p base regions in a similar manner. A gate electrode layer is then formed on an insulating film, over surfaces of channel regions provided by surface layers of the p base regions that are interposed between the n source regions and the n type semiconductor substrate, and a source electrode is formed in contact with both of the p base regions and the n source regions. A drain electrode is formed on the other surface of the n type semiconductor substrate. By applying a suitable voltage to the gate electrode, an inversion layer appears in each channel region, to reduce resistance between the drain electrode and the source electrode, and current is allowed to flow between the drain electrode and the source electrode through the inversion layer.

To produce IGBT as another type of the MOS type semiconductor device, an additional p type region is formed on the side of the drain electrode of the MOSFET. With the p type region thus added, the IGBT is capable of modulating the conductivity by utilizing injection of minority carriers.

The MOS type semiconductor devices as described above are widely used in switching circuits because the device provides low ON-state resistance and high switching speed, and can be easily controlled by changing voltage applied thereto.

In recent years, the MOS type semiconductor device used as a switching element in a switching circuit is more likely to receive surge voltage generated in the circuit, because of simplification of the switching circuit from which snubbers are eliminated, and reduction in the size of the semiconductor device. When the MOS type semiconductor device is used for cutting off current from an inductive load, for example, the voltage applied to the MOS type semiconductor device is increased due to energy stored in the inductor, and sometimes becomes even higher than power supply voltage. The resulting overvoltage stress may cause breakdown of the MOS type semiconductor device, and it has been thus desired to increase the breakdown voltage (avalanche withstand voltage) of the semiconductor device.

As one method for improving the capability of the MOS type semiconductor device to withstand avalanche breakdown, a part of the p base region is formed with a larger diffusion depth. The increase in the diffusion depth, however, affects the ON-state resistance and other characteristics of the device. For example, if the depth of a part of the p base region is changed from 5 $\mu$m to 7 $\mu$m in a certain MOSFET, the avalanche voltage increases by 25%, but at the same time the ON-state resistance increases by 15%. Thus, this method is not necessarily desirable in all aspects.

FIG. 6 shows an equivalent circuit of the MOSFET designed for improving the capability to withstand avalanche breakdown by another method.

In the circuit of FIG. 6, a series Zener diode array 3 is provided between the drain D and the gate G of the MOSFET. The series Zener diode array 3 includes a large number of pairs of Zener diodes that are connected in series such that each pair of diodes are formed back-to-back. In this arrangement, when the voltage applied to the drain D becomes higher than the clamp voltage of the series Zener diode array 3, a difference between the high voltage and the clamp voltage is applied to the gate G of the MOSFET, thereby to turn on the MOSFET. Namely, when an excess voltage is applied between the drain D and the gate G, the series Zener diode 3 functions to bypass the excess voltage between the drain D and the gate G so as to protect the device. Between the source S and the gate G, a pair of Zener diodes that are formed back-to-back and a resistor 6 are connected in parallel with each other. When an excessively high voltage is applied between the gate G and the source S, the pair of Zener diodes 5 function to bypass the excess voltage and protect the device. The resistor 6 functions to prevent high-voltage noise and others from being applied to the gate G due to disconnection of a gate lead, for example.

FIG. 7 is a cross-sectional view of MOSFET (as disclosed in U.S. Pat. No. 5,365,099) that realizes the circuit of FIG. 6.

The left-side part of FIG. 7 shows a generally used MOSFET, wherein an n drift layer 13 is laminated on an n+drain layer 11, and a plurality of p base regions 14 and p$^+$ wells 15 inside these regions 14 are formed in a surface layer of the n drift layer 13. Further, n source regions 16 are formed in surface layers of the p base regions 14. A gate electrode layer 18 made of, for example, polycrystalline silicon is formed on a gate oxide film 17 over portions of the p base regions 14 that are interposed between the n source regions 15 and an exposed surface of the n drift layer 13. A source electrode 19 made of Al alloy is formed in contact with both the p base regions 14 and the n source regions 16. The source electrode 19 extends over the gate electrode layer 18 such that these electrodes 18, 19 are insulated from each other by an interlayer insulating film 21 made of boron phosphorous silica glass (BPSG). A drain electrode 10 made of Ti/Ni/Au is formed on the rear surface of the n$^+$ drain layer 11. A unit structure having the n source region 16, source electrode 19, and other elements, above and below the p base region 14 will be called a cell structure. The cell structure is often formed in polygonal or rectangular shape, and a multiplicity of such cell structures are arranged in parallel with each other in an actual MOSFET.

An arrangement for improving the capability to withstand avalanche breakdown is illustrated in the right-side part of FIG. 11. An n$^+$ contact region 26 is formed in a surface layer of the n drift layer 13, and an auxiliary electrode 22 is formed in contact with the n$^+$ contact region 26. An array of a plurality of pairs of Zener diodes 23 that are connected in series is provided on a field oxide film 27 on the surface of the n drift layer 13. Each pair of the Zener diodes are formed back-to-back or oriented in opposite directions. The above-indicated auxiliary electrode 22 is connected to one end of the series Zener diode array 10, and an electrode 29 extending from the other end of the Zener diode array 10 is connected to the gate electrode 18 of the MOSFET.

In this structure, the potential of the auxiliary electrode 22 is almost equal to that of the drain electrode 10. When the voltage applied to the drain electrode 10 becomes higher than the clamp voltage of the series Zener diode array 23, therefore, a difference between the applied voltage and the clamp voltage is applied to the gate electrode layer 18 of the MOSFET, so as to turn on the MOSFET and protect the device.

The inventors of the present invention produced an IGBT provided with the arrangement for improving the capability to withstand avalanche breakdown, which has a similar structure to that of FIG. 7. FIG. 8(a) is a plan view of the IGBT chip thus produced. FIG. 8(a) shows a source electrode 1 of IGBT, a gate electrode 4, an auxiliary electrode 2, and a series Zener diode array 4 for improving the capability to withstand breakdown.

When the semiconductor device produced as described above was tested in the dynamic mode, so as to observe various dynamic characteristics thereof, the device broke down at a voltage lower than its static breakdown voltage, when the voltage applied to the device changes at a high rate (high dv/dt). The breakdown occurred at point A as indicated in FIG. 8(a), namely, at a point in a field insulating film formed between the series Zener diode array 3 and the n drift layer 13.

The semiconductor device also broke down at a relatively low voltage when cutting off current flowing from an inductive load. The breakdown occurred at point B as indicated in FIG. 8(a), namely, at an end portion of the source electrode close to the series Zener diode array 3.

SUMMARY OF THE INVENTION

It is therefore an object of the present invention to provide a MOS type semiconductor device which provides an increase breakdown voltage during its dynamic operations, and which can be easily manufactured, while assuring reliable operations.

As a result of various experiments as described later, which were conducted in an attempt to find such dimensions of the device that provide an improved breakdown voltage, the MOS type semiconductor device of the present invention is designed as described below.

The MOS type semiconductor device of the present invention includes a source electrode as a first main electrode formed on one of opposite major surfaces (the first major surface) of a semiconductor substrate, a gate electrode having a metal-oxide film-semiconductor (MOS) structure and used for controlling turn-on/turn-off of the device, a drain electrode as a second main electrode formed on the other major surface (second major surface) of the semiconductor substrate, an auxiliary electrode formed on the first major surface of the substrate and having substantially the same potential as the drain electrode, and a series Zener diode array provided between the auxiliary electrode and the gate electrode. In the MOS type semiconductor device thus constructed, the thickness T ($\mu$m) of a field insulating film that covers the first major surface of the substrate is determined as a function of the clamp voltage $V_{CE}$ (V) of the series Zener diode array, such that the thickness T is held in a range as represented by:

$T \geq 2.0 \times 10^{-3} \times V_{CE}$.

If the thickness of the field insulating film is increased to the range as indicated above, the transient dielectric breakdown of the field insulating film can be advantageously prevented, particularly when the voltage applied to the device changes at a high rate (dv/dt).

In one preferred form of the present invention, the width $W_1$ ($\mu$m) of a portion of the second-conductivity-type isolation well that is close to the field insulating film on which the series Zener diode array is provided is determined as a function of the clamp voltage $V_{CE}$ of the series Zener diode array, such that the width $W_1$ is held in a range as represented by:

$W_1 \geq 0.15 \ V_{CE}$.

In another preferred form of the present invention, the width $W_2$ ($\mu$m) of a portion of the second-conductivity-type isolation well that is close to the field insulating film on which the series Zener diode array is not provided is determined as a function of the clamp voltage $V_{CE}$ of the series Zener diode array, such that the width $W_2$ is held in a range as represented by:

$W_2 \geq 0.05 \ V_{CE}$.

By increasing the width of the second-conductivity-type isolation well in the above manners, the second-conductivity-type isolation well functions as an inlet for absorbing remaining carriers upon cut-off of current from an inductive load, and the concentration of the current into the cell portion can be prevented.

In the case of IGBT having a second-conductivity-type drain layer between the first-conductivity-type drift layer and the drain electrode, multiplication of carriers occurs due to injection of minority carriers, and therefore the control of the dimensions as described above yields far greater effects or advantages.

BRIEF DESCRIPTION OF THE DRAWINGS

The invention will be described in greater detail with reference to a certain preferred embodiment thereof and the accompanying drawings, wherein.

DETAILED DESCRIPTION OF THE PREFERRED EMBODIMENTS

One preferred embodiment of the present invention and experiments conducted for developing the present invention will be described in detail with reference to the drawings. In the following description, n or p prefixed to regions, layers, and the like, mean that majority carriers in these regions and layers are electrons and holes, respectively, and n type is regarded as the first conductivity type while p type is regarded as the second conductivity type, though these conductivity types may be reversed.

Figure 1:
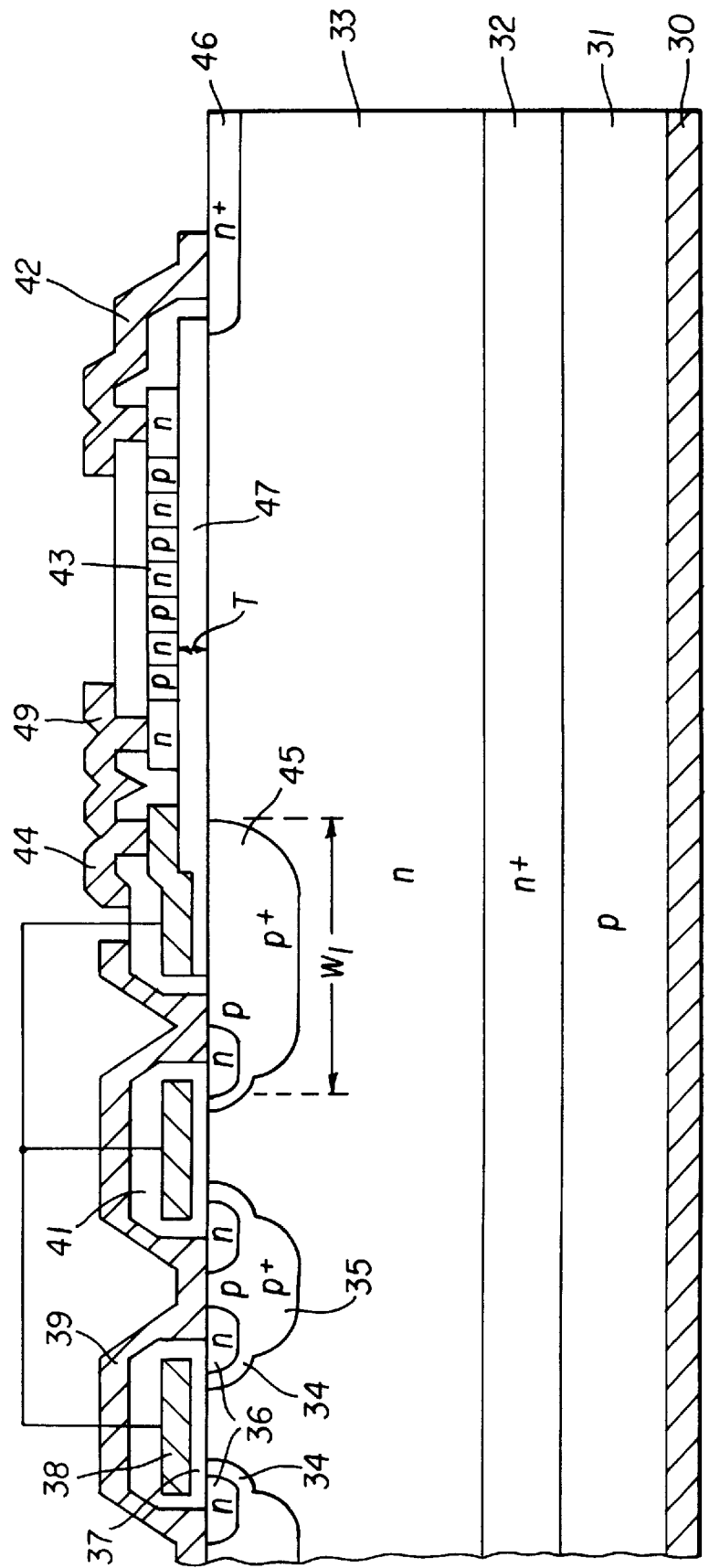
FIG. 1 is a cross sectional view showing a part of IGBT on which experiments were conducted.
Figure 8A:
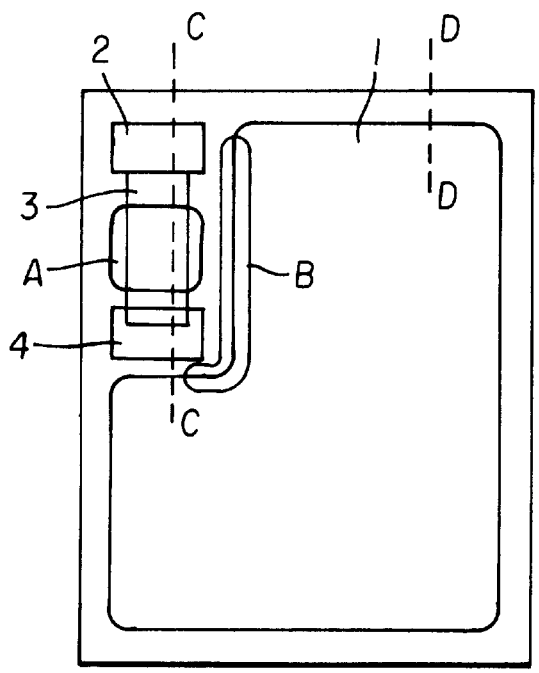
FIG. 8(a) is a plan view of one example of IGBT.

FIG. 1 is a cross-sectional view of IGBT produced as a test device. The plan view of the IGBT of the present embodiment is almost the same as that of the known IGBT as shown in FIG. 8(a), and the cross-sectional view of FIG. 1 is taken long line C—C of the plan view of FIG. 8(a). Here, collectors and emitters of IGBT will be called drains and sources, respectively, which are normally used when describing MOSFET.

The left-side portion of FIG. 1 shows a cell portion of IGBT that performs switching of current. The structure of the cell portion is substantially identical with that of known IGBT. More specifically, mutually separated p base regions 34 are formed in a surface layer of an n drift layer 33 having high resistivity, on the side of one of opposite major surfaces thereof, and $p^+$ well regions 35 having a higher impurity concentration and a larger diffusion depth than the p base regions 34 are formed as part of the p base regions 34, for the purpose of preventing latch-up of parasitic thyristor. An $n^+$ buffer layer 32 having lower resistance than the n drift layer 33 is formed on the other surface of the n drift layer 33, and a p drain layer 31 is formed on a surface of the $n^+$ buffer layer 32 remote from the n drift layer 33. Also, n source regions 36 are formed in selected areas of surface layers of the p base regions 34. A gate electrode layer 38 made of polycrystalline silicon is formed on a gate oxide film 37 over surfaces of the p base regions 34 interposed between the n source regions 36 and the n drift layer 33. In this manner, an n-channel type IGBT is provided. The surface of the gate electrode layer 38 is covered by an insulating film 41 formed of, for example, boron phosphorous silica glass (BPSG), on which a source electrode 39 is provided. Contact holes are formed through the insulating film 41 so that the source electrode 39 contacts with surfaces of both of the p base regions 34 and n source regions 36, and so that a gate electrode 44 made of a metal contacts with the gate electrode layer 38. A drain electrode 30 is formed on a surface of the p drain layer 31 remote from the $n^+$ buffer layer 32. In many cases, the source electrode 39 extends over the gate electrode layer 38, with the insulating film 41 interposed therebetween, as shown in FIG. 1.

The right-side portion of FIG. 1 shows an arrangement for improving the capability of the IGBT to withstand avalanche breakdown, and the right end of FIG. 1 corresponds to one edge of the IGBT chip. In this arrangement, an $n^+$ contact region 46 is formed in a surface layer of the n drift layer 33, and an auxiliary electrode 42 is formed in contact with the $n^+$ contact region 46. Since the potential of the $n^+$ contact region 46 and auxiliary electrode 42 is almost equal to that of the drain electrode 30, these region and electrode 46, 42 must be spaced enough apart from the cell portion of the IGBT. In some cases, a girdling structure, field plate structure, or other means for assuring high breakdown voltage, may be provided above or below a field oxide film 47 that is provided between the IGBT cell portion and the edge portion of the IGBT chip.

The field oxide film 47 having a sufficiently large thickness covers the surface of a portion of the n drift layer 33 that is located between the IGBT cell portion and the edge portion having the $n^+$ contact region 46 and auxiliary electrode 42. Also, a plurality of pairs of Zener diodes 43 connected in series, each pair of which consists of two diodes formed back-to-back, is provided on the field oxide film 47. These pairs of Zener diodes 43 will be called "series Zener diode array". The auxiliary electrode 42 as indicated above is connected to one end of the series Zener diode array 43, and an electrode 49 extending from the other end of the series Zener diode array 43 is connected to the gate electrode 44 of the IGBT. A $p^+$ isolation well 45 is provided at the periphery of the cell portion of the IGBT.

For use in experiments as described later, three types of wafers were prepared by laminating an n layer (that provides the $n^+$ buffer layer 32) having a resistivity of 0.2 Ω·cm and a thickness of 30 μm, on a p substrate (p drain layer 31) having a resistivity of 0.01 Ω·cm and a thickness of 500 μm, and epitaxially growing an n layer (that provides the n drift layer 33) having a resistivity of a selected one of 25 Ω·cm, 30 Ω·cm, and 35 Ω·cm, on the $n^+$ buffer layer 32. The rest of the structure may be produced by almost the same process as used for producing known IGBT, except for some minor changes, such as different patterns of masks. The p base regions 34, $p^+$ well regions 35, and p regions of the series Zener diode array 43 are formed by implantation of boron ions and thermal diffusion, and the n source regions 36 and n regions of the series Zener diode array 43 are formed by implantation of arsenic ions or phosphorous ions, and thermal diffusion. The series Zener diodes 43 use a polycrystalline silicon layer formed by the same reduced-pressure CVD as employed for forming the gate electrode layer 38. The p base regions 34 and n source regions 36 are formed by using the gate electrode layer 38 as part of masks, so that the edges of these regions 34, 36 are positioned as desired, and the widths of these regions 34, 36 are determined by lateral diffusions of the respective ions. The source electrode 39 and the gate electrode 44 are formed by sputtering of Al alloy and subsequent photolithography, and the drain electrode 30 is formed by depositing three layers of Ti, Ni and Au by sputtering, so as to be soldered to a metallic substrate.

The dimensions of the respective regions and layers of the IGBT may be determined as follows; the diffusion depth of the $p^+$ well 35 is 6 μm, and the diffusion depth of the p base region 34 is 4 μm, while the diffusion depth of the n source region 36 is 0.4 μm. The gate electrode layer 38 made of polycrystalline silicon has a thickness of 1 μm, and the source electrode 39 has a thickness of about 5 μm. To provide the series Zener diode array 43, 40 to 70 pairs of Zener diodes whose Zener voltage is about 8.5 V are connected in series, such that each pair of diodes are formed back-to-back.

Experiment 1

The experiment 1 was conducted by varying the thickness (denoted by "T" in FIG. 1) of the field oxide film 47 on which the series Zener diode array 43 is formed.

Figure 2:
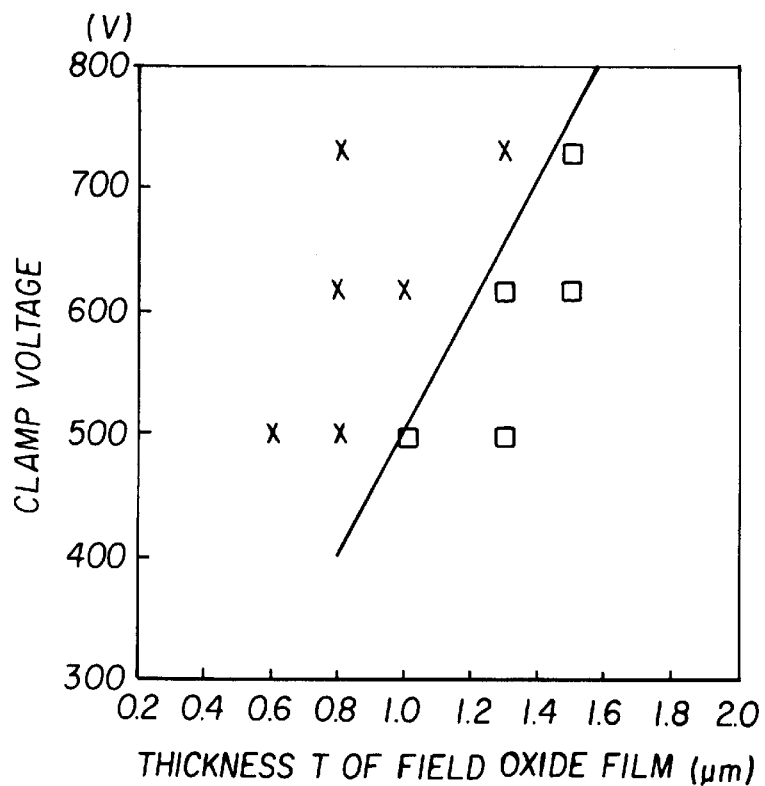
FIG. 2 is a graph showing the dependence of the capability to withstand a high rate of change in voltage (dv/dt), on the thickness of an oxide film.

The graph of FIG. 2 shows the dv/dt resistance of the device, namely, the capability to withstand a high rate of change in voltage, on the thickness of the field oxide film 47. In this graph, the horizontal axis indicates the thickness T of the field oxide film 47, and the vertical axis indicates the clamp voltage $V_{CE}$ of the series Zener diode array 43. In the test, dv/dt was set to 120 V/μs.

In the graph of FIG. 2, "X" means that breakdown occurred during the test, and "O" means that breakdown did not occur. The three levels of voltage correspond to three types of wafers used in the experiment. The static breakdown voltage of all of the three types is about 1.5 times as high as the clamp voltage. Even with the filed oxide film having the smallest thickness, 0.6 μm, in the experiment, the IGBT withstands a voltage of 900 V or higher in the static mode.

The results of the experiment in the dynamic mode, however, show that breakdown occurred at a lower voltage than the static breakdown voltage, but an increase in the thickness of the field oxide film 47 leads to an increase in the dynamic breakdown voltage, and improved capability to withstand a high rate of change in voltage.

The solid line shown in FIG. 2 is represented by the expression; $T=2.0\times10^{-3} V_{CE}$. To achieve a sufficient high breakdown voltage with rapid changes (dv/dt) in voltage with time, the thickness of the field oxide film needs to be controlled to be larger than the value obtained by the above expression. To provide a breakdown voltage of 700 V or higher at dv/dt being equal to 120 V/μs, it is desirable to control the thickness of the oxide film to be 1.5 μm or greater. The oxidizing temperature and time must be increased so as to form a thick oxide film, and it is therefore undesirable to increase the thickness of the oxide film to be larger than the required or desired value, which may result in reduced production efficiency and waste of time. In view of the production efficiency, therefore, the upper limit of the oxide film thickness is determined such that $T \leq 1.7 \times 10^{-2} V_{CE}$, preferably, $T \leq 7 \times 10^{-3} V_{CE}$.

When a voltage is applied to the device at a high rate of change (dv/dt), the breakdown occurs for the following reason; the depletion layer expands at a lower speed or rate as compared with the rate of change of the applied voltage, and therefore breakdown occurs at a point of time when the applied voltage exceeds the dielectric breakdown voltage of the field oxide film 47. If the thickness of the filed oxide film 47 is increased, the dielectric breakdown voltage can be increased, and the breakdown can be thus prevented.

Experiment 2

Experiment 2 was conducted by varying the width ($w_1$ in FIG. 1) of the p⁺ isolation well 45 that is located close to a portion of the field oxide film 47 on which the series Zener diode array 43 is provided.

Figure 3:
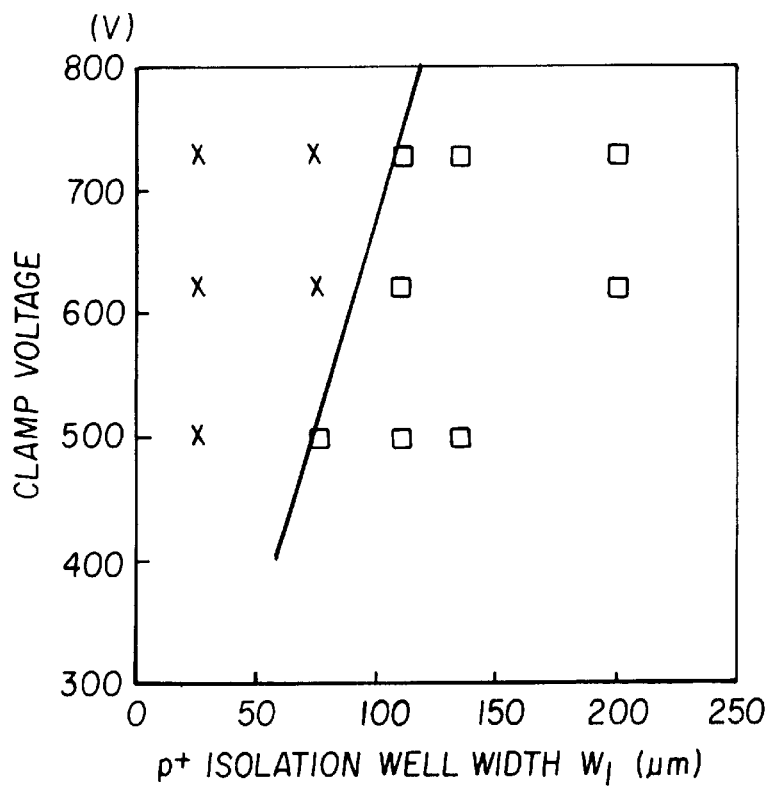
FIG. 3 is a graph showing the dependence of the capability to withstand an L (inductive) load, on the width $w_1$ of a $p^+$ isolation well.

The graph of FIG. 3 shows the dependence of the breakdown voltage of the device when it is connected to an inductive load, on the width ($w_1$) of the p⁺ isolation well. The horizontal axis of the graph indicates width $w_1$ of the p⁺ isolation region, and the vertical axis indicates clamp voltage $V_{CE}$ of the series Zener diode array 43. The inductance of the load was 1 mH, and about 14A current was cut off by the device.

In the graph of FIG. 3, too, "X" means that breakdown occurred during the test, and "O" means that breakdown did not occur. The three levels of voltage correspond to the three types of wafers used in the experiment.

It will be understood from FIG. 3 that the breakdown is likely to occur as the width $w_1$ of the p⁺ isolation well 45 is reduced, and the breakdown voltage is increased with an increase in the p⁺ isolation well width w1. The solid line shown in FIG. 3 is represented by the expression:

$w_1 = 0.15\ V_{CE}$.

To achieve a sufficiently high breakdown voltage, therefore, the width of the p⁺ isolation well 45 must be larger than the value obtained by this expression. To realize the breakdown voltage of 700 V or higher, for example, the width $w_1$ of the p⁺ isolation well 45 needs to be 110 μm or greater. In this case, since an unnecessary or excessive increase in the width only results in reduced efficiency in using the substrate, which is wasteful, the upper limit of the width is preferably determined such that $w_1 \leq 1.5\ V_{CE}$, and, more preferably, $w_1 \leq 0.75\ V_{CE}$.

When the portion of the p⁺ isolation well 45 on which the series Zener diode array 43 is provided has a small width $w_1$, the breakdown occurs because carriers accumulated in the cell portion and its vicinity during turn-on of IGBT are concentrated in an end portion of the cell portion upon turn-off (or cut-off of current). If the width $w_1$ of the p⁺ isolation well 45 is increased, carriers that are not present in the cells are absorbed by the p⁺ isolation well 45, thereby preventing the carriers to be concentrated in the end portion of the cell portion, and thus avoiding breakdown.

Experiment 3

Figure 4:
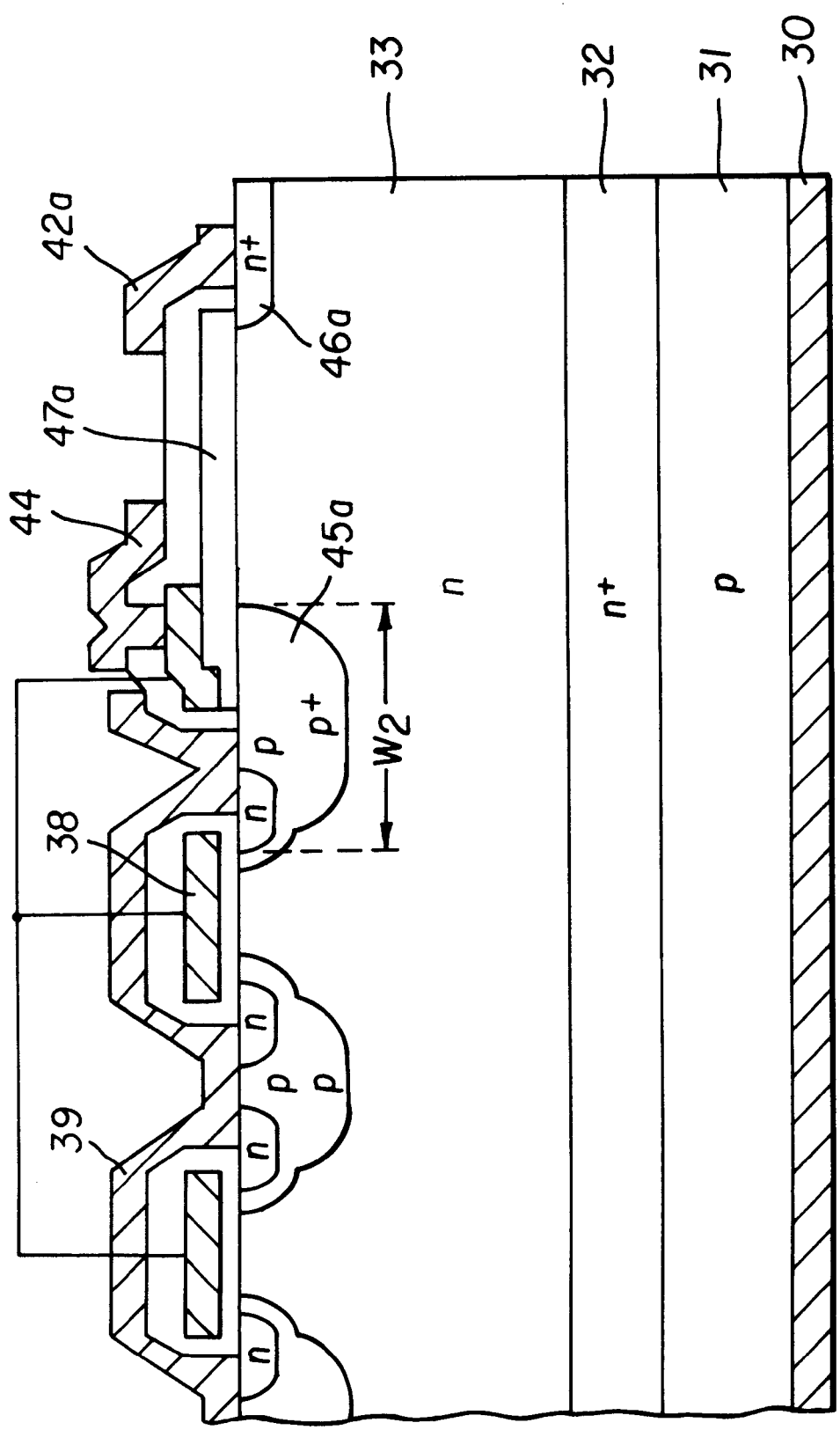
FIG. 4 is a cross-sectional view showing another cross section of a part of the IGBT on which an experiment was conducted.
Figure 6:
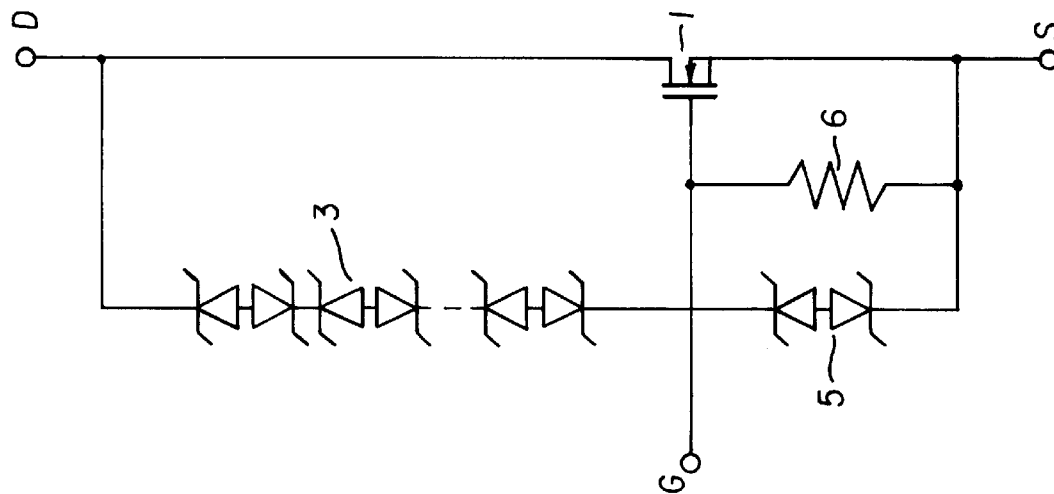
FIG. 6 is a view showing an equivalent circuit of a known MOSFET.

FIG. 4 is a cross-sectional view showing the IGBT produced as a test device, in cross section taken along line D—D of FIG. 8(a). The right end of FIG. 4 corresponds to one edge of the IGBT chip. In the IGBT shown in FIG. 4, an n⁺ peripheral region 46a is formed in a surface layer of the n drift layer 33, and a peripheral electrode 42a is formed in contact with the n⁺ peripheral region 46a. Since the potential of the n⁺ peripheral region 46a and peripheral electrode 42a is almost equal to that of the drain electrode 30, these region and electrode 46a, 42a must be spaced enough away from the cell portion 1 of the IGBT. Although the surface of the n drift layer 33 between the cell portion and the peripheral portion (42a, 46a) is covered with a thick field oxide film 47a, the width of the oxide film 47a need not be so large since the series Zener diode array is not provided on the field oxide film 47a in this part of the IGBT. A p⁺ isolation well 45a is provided in a peripheral part of the cell portion of the IGBT.

An experiment was conducted by varying the width ($w_2$ in FIG. 4) of the p⁺ isolation well portion 45a on which the series Zener diode array is not provided.

Figure 5:
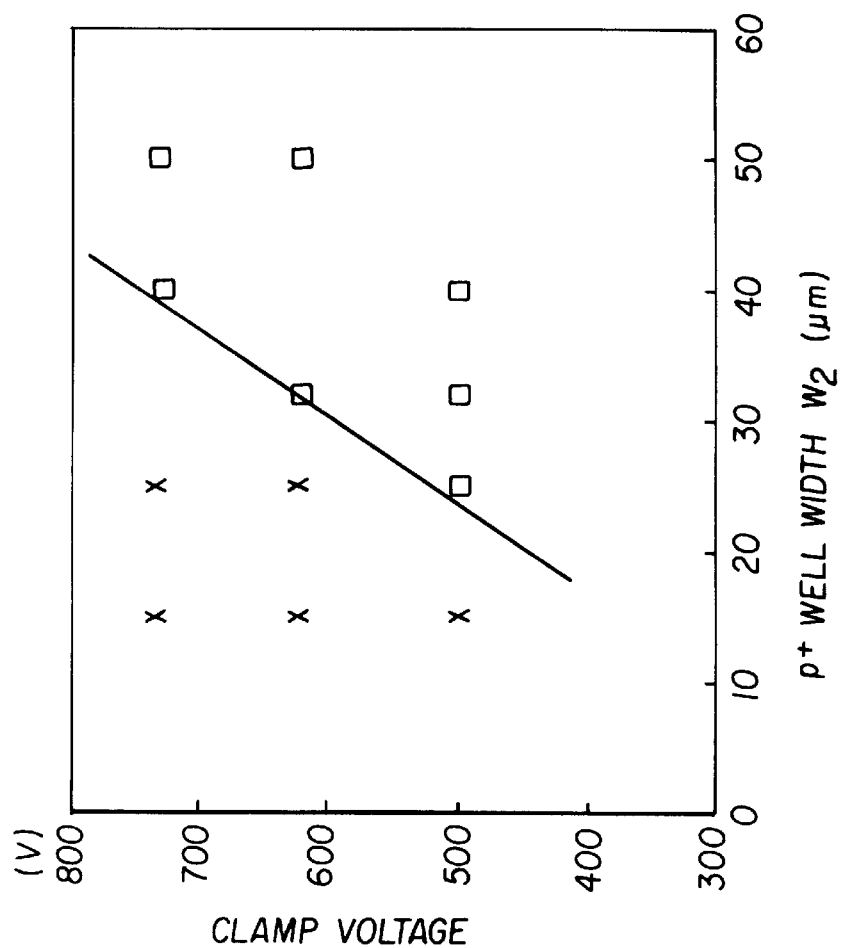
FIG. 5 is a view showing the dependence of the capability to withstand an L (inductive) load, on the width $w_2$ of the $p^+$ isolation well.
Figure 7:
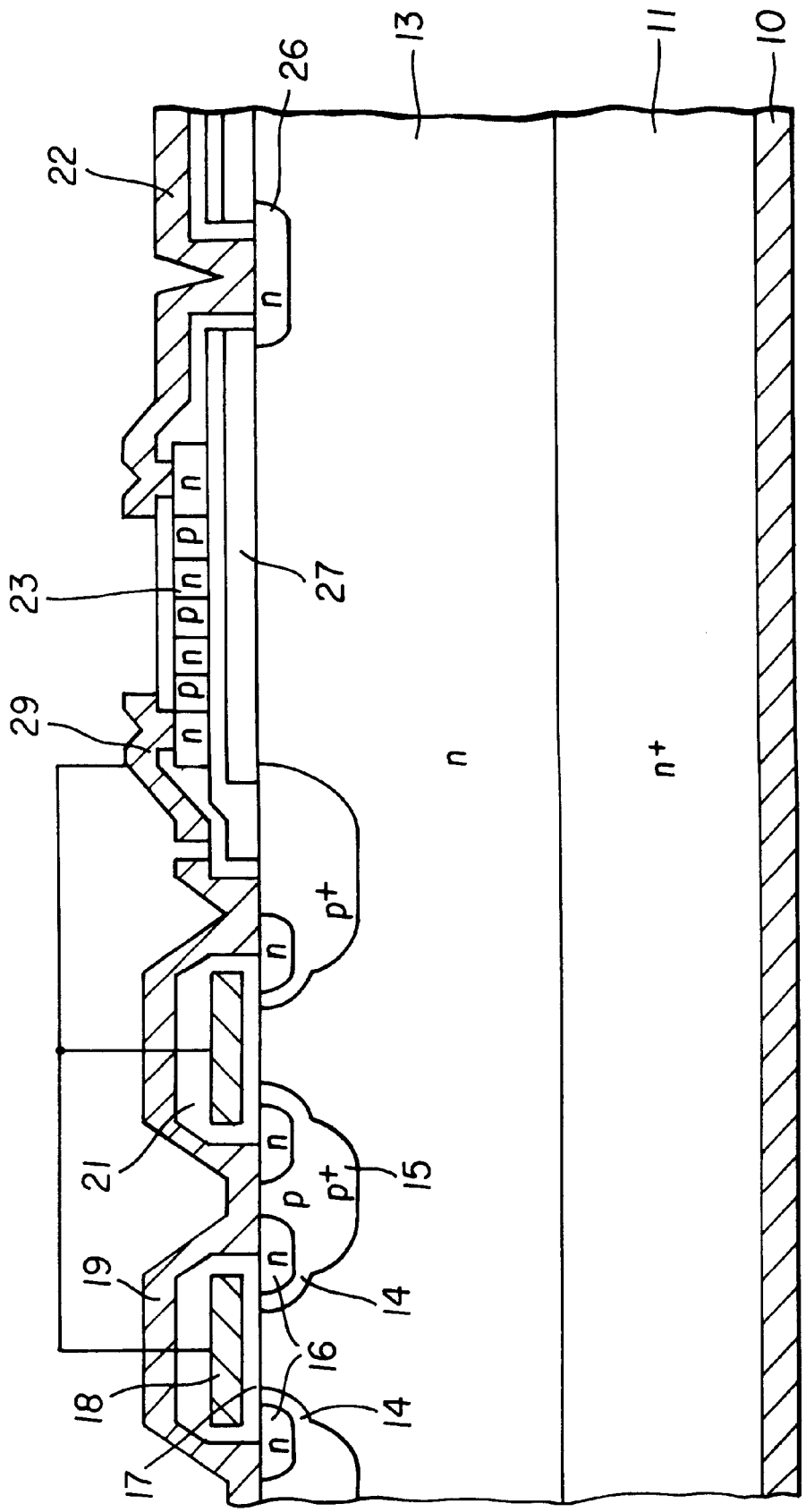
FIG. 7 is a cross sectional view of the known MOSFET.

The graph of FIG. 5 shows the capability of test devices to withstand an L load, on the width $w_2$ of the p⁺ isolation well 45, when the three types of wafers as described above were used for the test devices. In the graph, the horizontal axis indicates width $w_2$ of the p⁺ isolation well 45a, and the vertical axis indicates clamp voltage $V_{CE}$ of the series Zener diode array 43. The conditions of the experiment are the same as those of Experiment 2.

In the graph of FIG. 5, too, "X" means that breakdown occurred during the test, and "O" means that breakdown did not occur. The three levels of test voltages correspond to the above three types of wafers used in the experiment.

It will be understood from the graph of FIG. 5 that the breakdown is likely to occur if the width $w_2$ of the p⁺ isolation well 45 is relatively small, and the breakdown does not occur if the width $w_2$ is sufficiently large. The solid line shown in FIG. 5 is represented by the expression:

$w_2 = 0.05\ V_{CE}$.

To achieve a sufficiently high breakdown voltage to resist or withstand the L load, the width $w_2$ of the p⁺ isolation well 45a must be larger than the value obtained by the above expression. To realize the breakdown voltage of 700 V or higher, for example, the width $w_2$ of the p⁺ isolation well 45a needs to be 40 μm or greater. In this case, too, since an unnecessary or excessive increase in the width only results in reduced efficiency in the use of the substrate, which is wasteful, the upper limit of the width is preferably determined such that $w_2 \leq 0.5\ V_{CE}$, and, more preferably, $w_1 \leq 0.25\ V_{CE}$.

When the p⁺ isolation well portion 45a on which the series Zener diode array 43 is not provided has a small width $w_2$, the breakdown occurs because carriers that are present in a portion outside the cell portion are concentrated in the end portion of the cell portion upon cut-off of the current. It is, however, to be noted that a relatively small amount of carriers remain in the portion outside the cell portion at the time of cut-off of the current, as compared with the amount of carriers in the portion on which the series Zener diode array is provided, and therefore the width $w_2$ of the p⁺ isolation well 45a need not be so larger as the width $w_1$ of the p⁺ isolation well 45 in the case of Experiment 2

When an IGBT having a sufficiently large thickness (T) of the field oxide film, and sufficiently large widths ($w_1$, $W_2$) of the p⁺ isolation well was produced based on the results of the above experiment, the resulting IGBT showed an increased breakdown voltage with improved capability to withstand a high rate of change in the voltage (dv/dt) and resist an L load, thus assuring satisfactory dynamic characteristics.

Figure 8B:
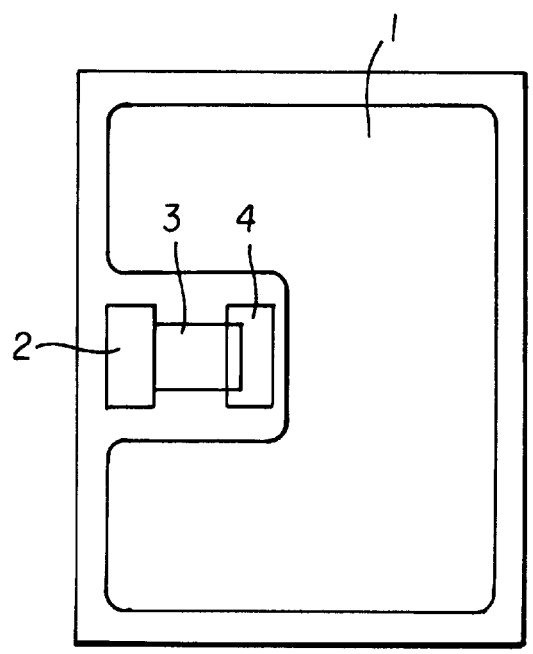
FIGS. 8(b), 8(c), and 8(d) are plan views of its modified examples.
Figure 8C:
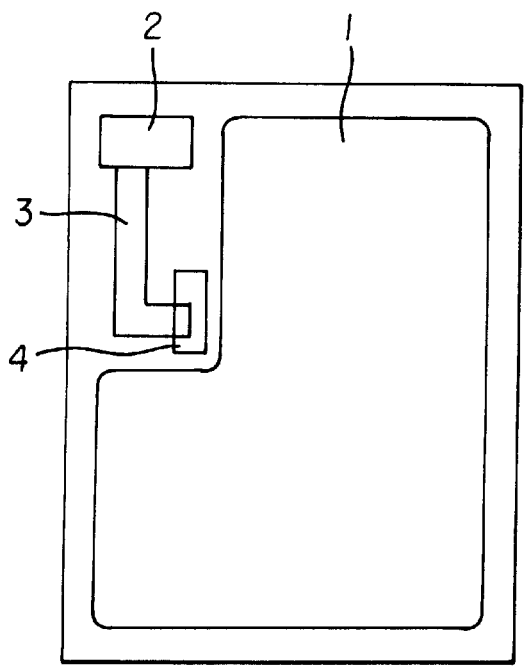
Figure 8D:
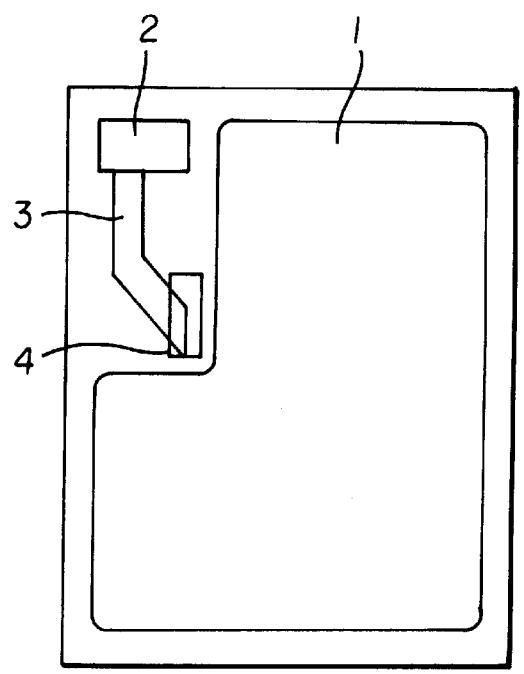

FIG. 8(b) to FIG. 8(d) show modified examples having different arrangements of the auxiliary electrode 2, series Zener diode array 3, and the gate electrode 4. As shown in these figures, the auxiliary electrode 2 is preferably located in the vicinity of the edge of the chip, and the series Zener diode array 3 is preferably located between the auxiliary electrode 2 and the gate pad 4.

As explained above, in the MOS type semiconductor device of the present invention having the series Zener diode array for overvoltage protection, the thickness T($\mu$m) of the field insulating film that covers the first major surface of the substrate is determined as a function of the clamp voltage $V_{CE}$ (V) of the series Zener diode array, such that the thickness T is held in the range as represented by:

$T \geq 2.0 \times 10^{-3} \times V_{CE}$.

With the thickness T of the field insulating film controlled to this range, the dielectric breakdown of the field insulating film can be advantageously prevented, particularly when the voltage applied to the device changed at a high rate (dv/dt), and thus the breakdown voltage can be significantly increased, as is understood from the experiment as described above.

Also, the width $W_1$ ($\mu$m) of a portion of the second-conductivity-type isolation well that is close to the field insulating film on which the series Zener diode array is provided, and the width $W_2$ ($\mu$m) of another portion of the second-conductivity-type isolation well that is close to the field insulating film on which the series Zener diode array is not provided, are determined as a function of the clamp voltage $V_{CE}$ of the series Zener diode array, such that the width $W_1$ and the width $W_2$ are held in respective ranges as represented by:

$W_1 \geq 0.15 V_{CE}$,
$W_2 \geq 0.05 V_{CE}$.

By controlling the widths $W_1$, $W_2$ to these ranges, respectively, the second-conductivity-type isolation well serves as an inlet for absorbing remaining carriers upon cut-off of current from an inductive load, and the current concentration into the cell portion can be prevented, thus assuring a significantly increased breakdown voltage, as is understood from the experiments as described above.

In the IGBT of the illustrated embodiment which performs conductivity modulation, a large amount of carriers are accumulated in the cell portion and its vicinity, and therefore the present invention is particularly effective to avoid concentration of the carriers. In other types of MOS type semiconductor devices, too, the present invention provides a similar effect since some carriers diffuse in the lateral direction.

In recent years, the MOS semiconductor device as a switching element is more likely to be subjected to severe stresses, because of simplification of the circuit from which snubbers are eliminated, and reduction in the size of the device. In this situation, the present invention makes a great contribution to an increase in the breakdown voltage during dynamic operations.

What is claimed is:

1. A MOS type semiconductor device, comprising:
a first-conductivity-type drift layer at a side of a first main surface of said semiconductor device;
a second-conductivity-type base region formed at the surface of said first-conductivity-type drift layer;
a first-conductivity-type source region formed at selected area of surface layer of said second-conductivity-type base region;
a gate electrode layer formed on a gate insulating film over surface of said second-conductivity-type base region that are interposed between said first-conductivity-type source region and said first-conductivity-type drift layer;
a source electrode found in contact with both of said first-conductivity-type source region and said second-conductivity-type base region;
a drain electrode formed on a second main surface of said semiconductor device;
a gate electrode formed in contact with said gate electrode layer;
a first-conductivity-type contact region formed at a surface layer of said first-conductivity-type drift layer, such that the contact region is spaced apart from said second-conductivity-type base region;
an auxiliary electrode formed in contact with said first-conductivity-type contact region, said auxiliary electrode having substantially the same potential as said drain electrode;
a field insulating film that covers a portion of the first main surface of said first-conductivity-type drift layer that is located between said second-conductivity-type base region and said first-conductivity-type contact region; and
a series Zener diode array formed on said field insulating film and comprising a plurality of pairs of Zener diodes connected in series such that each pair of Zener diodes are formed back-to-back, said series Zener diode array having one end connected to said gate electrode, and the other end connected to said auxiliary electrode,
wherein said field insulating film has a thickness T ($\mu$m) that is determined as a function of a clamp voltage $V_{CE}$ (V) of said series Zener diode array, such that the thickness T is held in a range represented by:
$T \geq 2.0 \times 10^{-3} \times V_{CE}$.

2. A MOS type semiconductor device, comprising:
a first-conductivity-type drift layer at a side of a first main surface of said semiconductor device;
a second-conductivity-type base region formed at the surface of said first-conductivity-type drift layer;
a first-conductivity-type source region formed at selected area of surface layer of said second-conductivity-type base region;
a gate electrode layer formed on a gate insulating film over surface of said second-conductivity-type base region that are interposed between said first-conductivity-type source region and said first-conductivity-type drift layer;
a source electrode found in contact with both of said first-conductivity-type source region and said second-conductivity-type base region;
a drain electrode formed on a second main surface of said semiconductor device;
a gate electrode formed in contact with said gate electrode layer;
a first-conductivity-type contact region formed at a surface layer of said first-conductivity-type drift layer, such that the contact region is spaced apart from said second-conductivity-type base region;
an auxiliary electrode formed in contact with said first-conductivity-type contact region, said auxiliary electrode having substantially the same potential as said drain electrode;
a field insulating film that covers a portion of the first main surface of said first-conductivity-type drift layer that is located between said second-conductivity-type base region and said first-conductivity-type contact region;

a series Zener diode array formed on said field insulating film and comprising a plurality of pairs of Zener diodes connected in series such that each pair of Zener diodes are formed back-to-back, said series Zener diode array having one end connected to said gate electrode, and the other end connected to said auxiliary electrode, and a second-conductivity-type isolation well located between said field insulating film and said second-conductivity-type base region, wherein a first portion of said second-conductivity-type isolation well that is close to the field insulating film on which the series Zener diode array is provided has a first width $W_1$ ($\mu$m) that is determined as a function of the clamp voltage $V_{CE}$ of the series Zener diode array, so that the first width $W_1$ is held in a range represented by:

$W_1 \geq 0.15\ V_{CE}$.

3. A MOS type semiconductor device, comprising:

a first-conductivity-type drift layer at a side of a first main surface of said semiconductor device;

a second-conductivity-type base region formed at the surface of said first-conductivity-type drift layer;

a first-conductivity-type source region formed at selected area of surface layer of said second-conductivity-type base region;

a gate electrode layer formed on a gate insulating film over surface of said second-conductivity-type base region that are interposed between said first-conductivity-type source region and said first-conductivity-type drift layer;

a source electrode found in contact with both of said first-conductivity-type source region and said second-conductivity-type base region;

a drain electrode formed on a second main surface of said semiconductor device;

a gate electrode formed in contact with said gate electrode layer;

a first-conductivity-type contact region formed at a surface layer of said first-conductivity-type drift layer, such that the contact region is spaced apart from said second-conductivity-type base region;

an auxiliary electrode formed in contact with said first-conductivity-type contact region, said auxiliary electrode having substantially the same potential as said drain electrode;

a field insulating film that covers a portion of the first main surface of said first-conductivity-type drift layer that is located between said second-conductivity-type base region and said first-conductivity-type contact region;

a series Zener diode array formed on said field insulating film and comprising a plurality of pairs of Zener diodes connected in series such that each pair of Zener diodes are formed back-to-back, said series Zener diode array having one end connected to said gate electrode, and the other end connected to said auxiliary electrode, and a second-conductivity-type isolation well located between said field insulating film and said second-conductivity-type base region, wherein a second portion of said second-conductivity-type isolation well that is close to the field insulating film on which the series Zener diode array is not provided has a second width $W_2$ ($\mu$m) that is determined as a function of the clamp voltage $V_{CE}$ of the series Zener diode array, so that the second width $W_2$ is held in a range represented by:

$W_2 \geq 0.05\ V_{CE}$.

4. A MOS type semiconductor device as defined in claim 1, further comprising a second-conductivity-type drain layer provided between said first-conductivity-type drift layer and said drain electrode.

5. A MOS type semiconductor device as defined in claim 2, further comprising a second-conductivity-type drain layer provided between said first-conductivity-type drift layer and said drain electrode.

6. A MOS type semiconductor device as defined in claim 3, further comprising a second-conductivity-type drain layer provided between said first-conductivity-type drift layer and said drain electrode.

* * * * *